US012641954B2

(12) United States Patent (10) Patent No.: US 12,641,954 B2
Tomita (45) Date of Patent: May 26, 2026

(54) MEASURING METHOD AND MEASURING DEVICE

(71) Applicant: Magnolia White Corporation, Tokyo (JP)

(72) Inventor: Satoru Tomita, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 356 days.

(21) Appl. No.: 18/470,456

(22) Filed: Sep. 20, 2023

(65) Prior Publication Data

US 2024/0099059 A1 Mar. 21, 2024

(30) Foreign Application Priority Data

Sep. 20, 2022 (JP) ................................. 2022-148725

(51) Int. Cl.
| | |
|---|---|
| *H10K 59/12* | (2023.01) |
| *G02B 21/26* | (2006.01) |
| *G02B 21/36* | (2006.01) |
| *H10K 59/121* | (2023.01) |
| *H10K 77/10* | (2023.01) |
| *H10K 102/00* | (2023.01) |

(52) U.S. Cl.
CPC ......... *H10K 59/1201* (2023.02); *G02B 21/26* (2013.01); *G02B 21/361* (2013.01); *G02B 21/365* (2013.01); *H10K 59/121* (2023.02); *H10K 77/10* (2023.02); *H10K 2102/302* (2023.02)

(58) Field of Classification Search
CPC .. H10K 59/1201; H10K 59/121; H10K 77/10;

H10K 2102/302; H10K 59/352; H10K 59/122; H10K 71/70; G02B 21/26; G02B 21/361; G02B 21/365; H01L 22/12
See application file for complete search history.

(56) References Cited

U.S. PATENT DOCUMENTS

| | | | | |
|---|---|---|---|---|
| 5,701,055 A | * | 12/1997 | Nagayama | ........... H10K 59/122 313/506 |
| 5,783,833 A | * | 7/1998 | Sugaya | ............... G03F 7/70425 250/548 |

(Continued)

FOREIGN PATENT DOCUMENTS

| | | |
|---|---|---|
| JP | 2000-195677 A | 7/2000 |
| JP | 2004-207217 A | 7/2004 |

(Continued)

OTHER PUBLICATIONS

Japanese Office Action issued Mar. 24, 2026, in corresponding JP Application No. 2022-148725, 8pp.

*Primary Examiner* — Bitew A Dinke
(74) *Attorney, Agent, or Firm* — XSENSUS LLP

(57) ABSTRACT

According to one embodiment, a measuring method includes forming a partition including a lower portion arranged on a first surface side of a base and an upper portion protruding from a side surface of the lower portion, acquiring a first image including the partition observed from a second surface side opposed to the first surface of the base by an optical microscope, analyzing the acquired first image, and measuring an amount of protrusion by which an end portion of the upper portion protrudes from the side surface of the lower portion, based on the analysis result.

20 Claims, 16 Drawing Sheets

(56)        References Cited

U.S. PATENT DOCUMENTS

| | | | | |
|---|---|---|---|---|
| 6,037,712 | A  * | 3/2000 | Codama | ................. H10K 59/10 |
| | | | | 428/917 |
| 2004/0160170 | A1 | 8/2004 | Sato et al. | |
| 2009/0009069 | A1 | 1/2009 | Takata | |
| 2016/0149156 | A1* | 5/2016 | Kim | ..................... H10K 59/121 |
| | | | | 438/46 |
| 2017/0125246 | A1* | 5/2017 | Bae | ..................... H01L 21/3086 |
| 2017/0299376 | A1* | 10/2017 | Fresquet | ................. H01L 22/12 |
| 2018/0156597 | A1* | 6/2018 | Smith | ................. G01B 9/02007 |
| 2019/0363275 | A1 | 11/2019 | Ochi et al. | |
| 2020/0241220 | A1* | 7/2020 | Evans | ...................... G02B 6/13 |
| 2021/0151707 | A1* | 5/2021 | Huang | ............... H10K 59/1216 |
| 2021/0376283 | A1* | 12/2021 | Shin | ..................... H10K 59/124 |
| 2022/0077251 | A1* | 3/2022 | Choung | ............... H10K 59/873 |
| 2023/0219114 | A1* | 7/2023 | Takenaka | ................. B05D 1/36 |
| | | | | 427/255.6 |
| 2024/0276818 | A1* | 8/2024 | Liu | ..................... H10K 59/122 |

FOREIGN PATENT DOCUMENTS

| | | | |
|---|---|---|---|
| JP | 2008-135325 | A | 6/2008 |
| JP | 2009-032673 | A | 2/2009 |
| JP | 2009080404 | A | 4/2009 |
| JP | 2010-118191 | A | 5/2010 |
| JP | 2012182121 | A | 9/2012 |
| JP | 2013-213733 | A | 10/2013 |
| WO | 2018/179308 | A1 | 10/2018 |

* cited by examiner

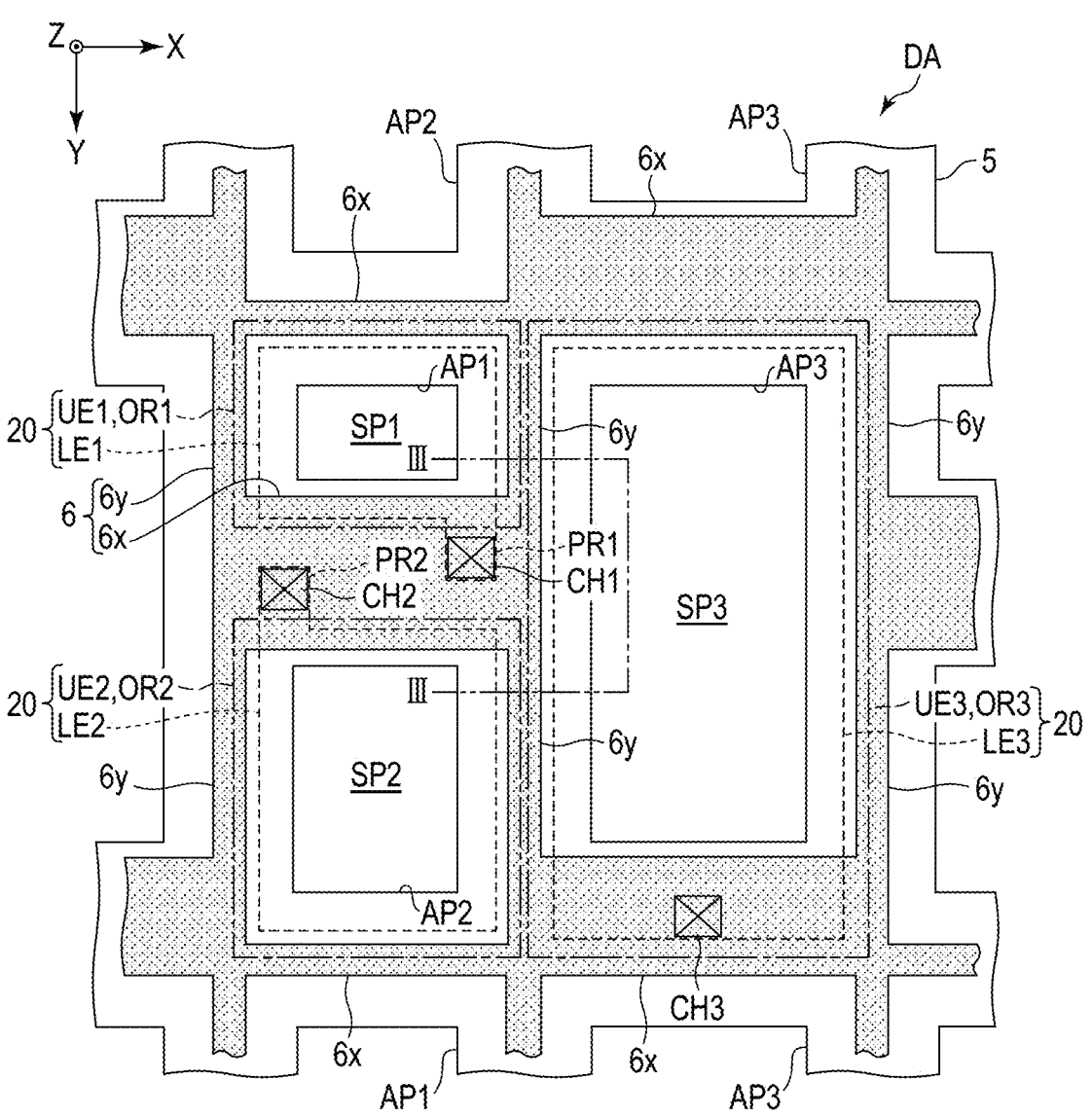
F I G. 2

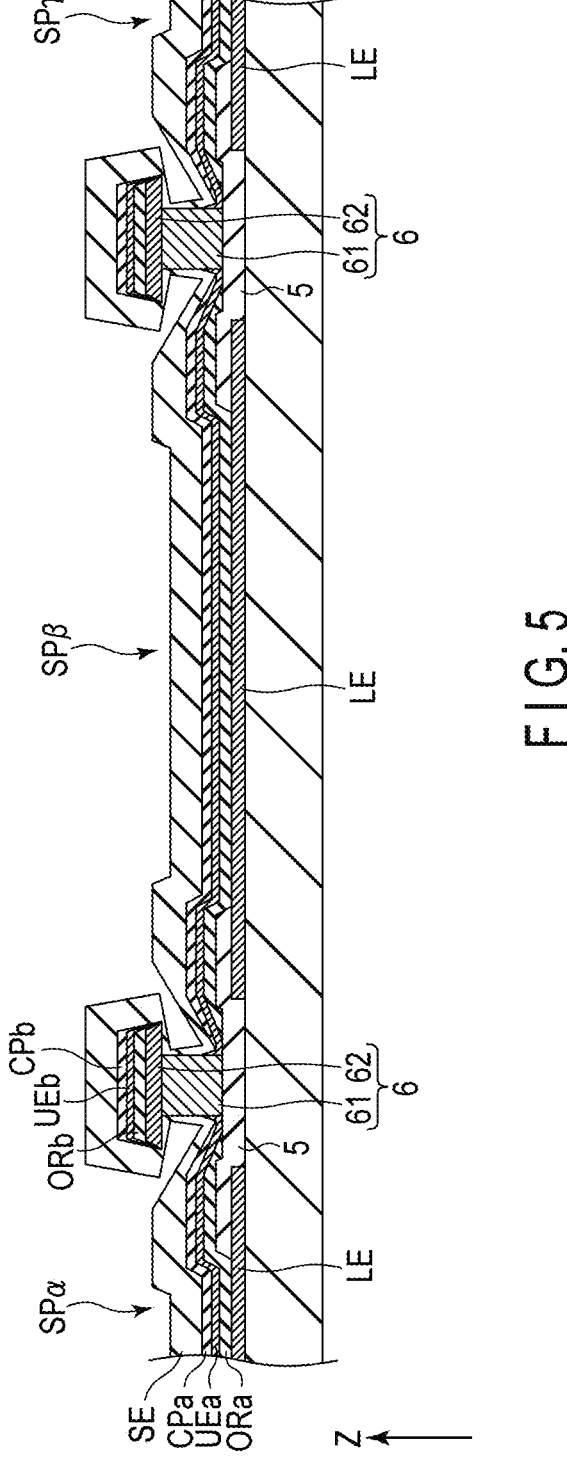
F I G. 5

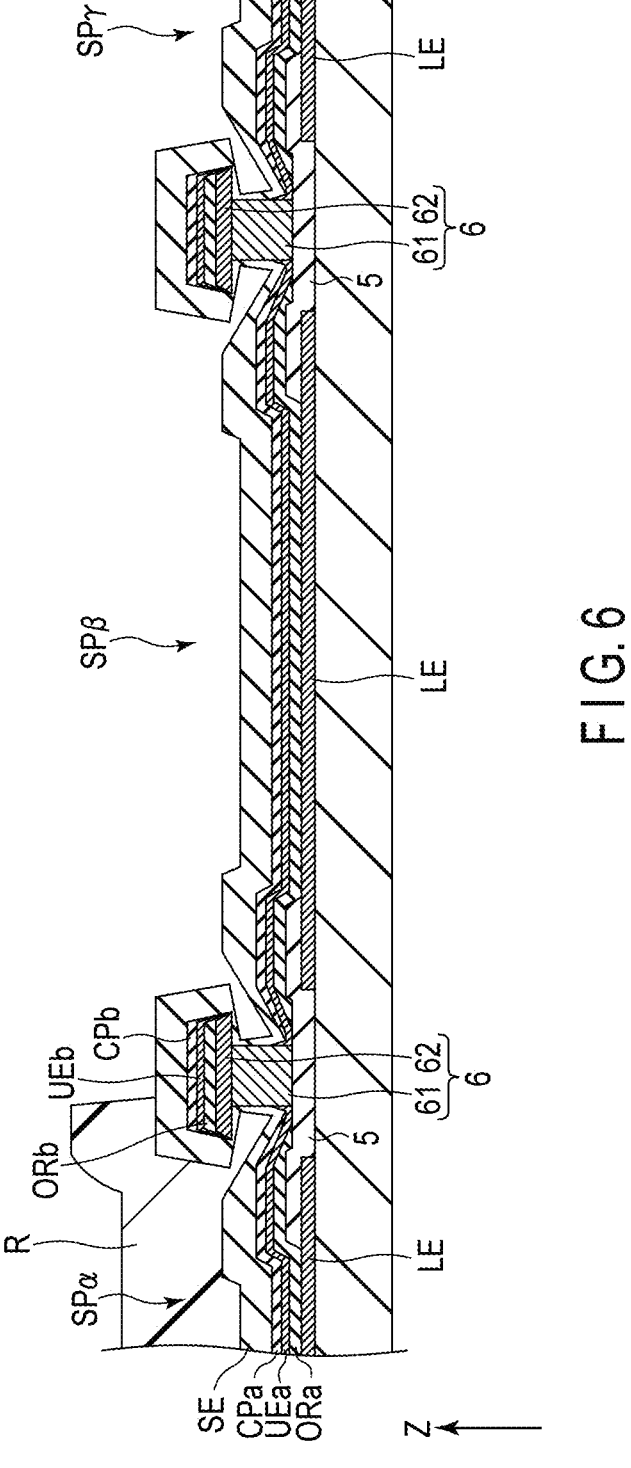
F I G . 6

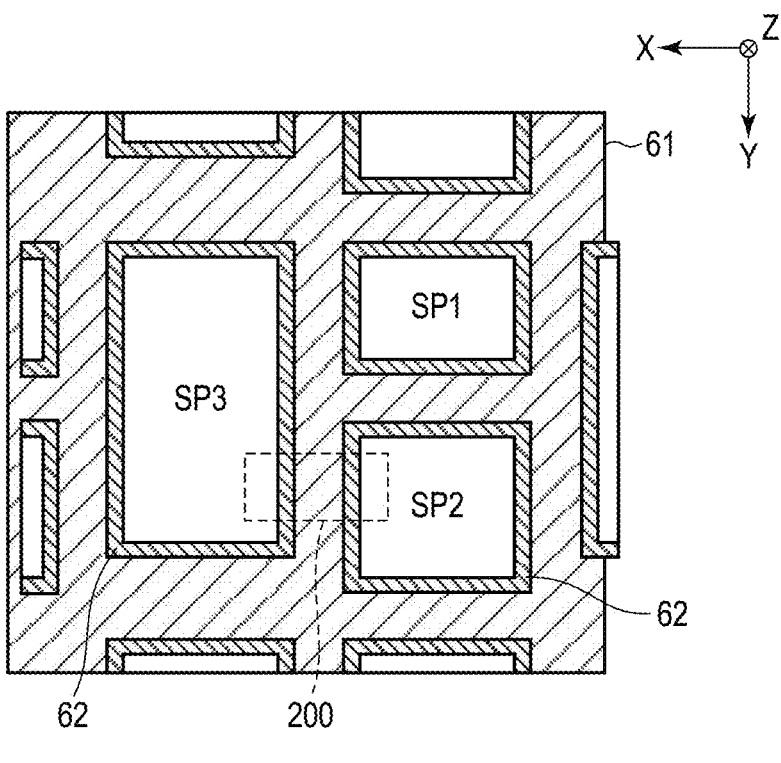
F I G. 10
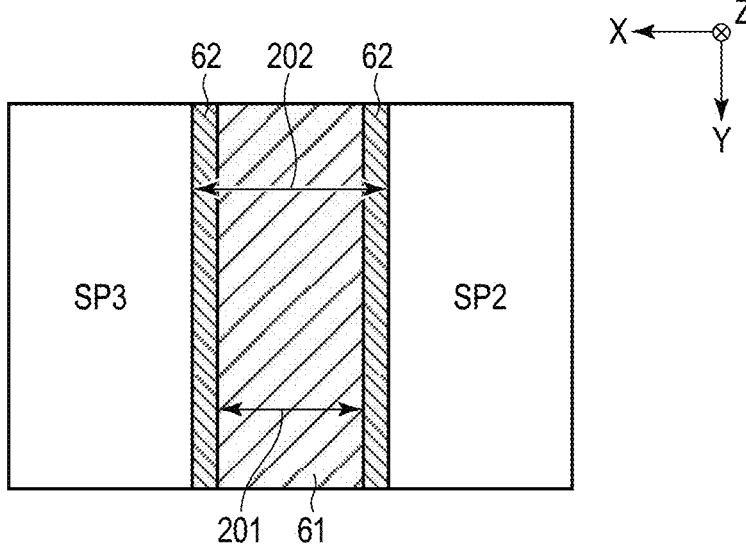
F I G. 11

| Pixels | R | G | B |
|---|---|---|---|
| ... | ... | ... | ... |
| 16 | 220 | 132 | 122 |
| 17 | 223 | 135 | 125 |
| 18 | 224 | 135 | 127 |
| 19 | 231 | 140 | 137 |
| 20 | 230 | 139 | 138 |
| 21 | 229 | 139 | 138 |
| 22 | 228 | 138 | 137 |
| 23 | 226 | 136 | 135 |
| 24 | 223 | 135 | 133 |
| 25 | 221 | 133 | 131 |
| 26 | 218 | 133 | 130 |
| 27 | 222 | 139 | 135 |
| 28 | 223 | 140 | 136 |
| 29 | 222 | 141 | 137 |
| 30 | 224 | 143 | 139 |
| 31 | 224 | 145 | 140 |
| 32 | 225 | 146 | 141 |
| ... | ... | ... | ... |

FIG. 16

MEASURING METHOD AND MEASURING DEVICE

CROSS-REFERENCE TO RELATED APPLICATIONS

This application is based upon and claims the benefit of priority from Japanese Patent Application No. 2022-148725, filed Sep. 20, 2022, the entire contents of which are incorporated herein by reference.

FIELD

Embodiments described herein relate generally to a measuring method and a measuring device.

BACKGROUND

Recently, display devices with organic light-emitting diodes (OLEDs) applied thereto as display elements have been put into practical use.

However, if the display devices are not manufactured appropriately, reliability of the display devices may be decreased. Therefore, a technique of suppressing the reduction in reliability has been required in a process of manufacturing such a display device.

BRIEF DESCRIPTION OF THE DRAWINGS

FIG. 2 is a view showing an example of a layout of sub-pixels.

FIG. 5 is a schematic cross-sectional view illustrating a display element formed using a partition.

FIG. 6 is a schematic cross-sectional view illustrating the display element formed using the partition.

FIG. 10 is a view showing an example of a microscopic image.

FIG. 11 is a view showing an image expanding an area of a part of the microscopic image.

FIG. 16 is a table showing an example of luminance values of a plurality of pixels constituting the to-be-measured area.

DETAILED DESCRIPTION

Figure 1:
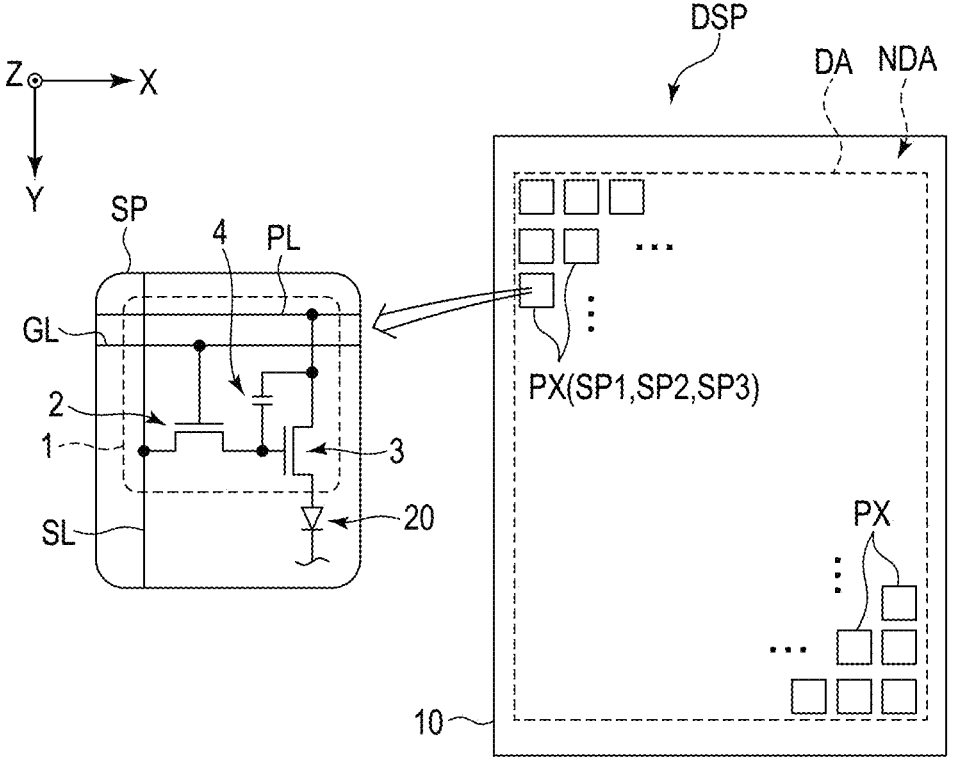
FIG. 1 is a view showing a configuration example of a display device according to an embodiment.

In general, according to one embodiment, a measuring method includes forming a partition including a lower portion arranged on a first surface side of a base and an upper portion protruding from a side surface of the lower portion, acquiring a first image including the partition observed from a second surface side opposed to the first surface of the base by an optical microscope, analyzing the acquired first image, and measuring an amount of protrusion (D) by which an end portion of the upper portion protrudes from the side surface of the lower portion, based on the analysis result.

An embodiment will be described hereinafter with reference to the accompanying drawings.

The disclosure is merely an example, and proper changes within the spirit of the invention, which are easily conceivable by a person of ordinary skill in the art, are included in the scope of the invention as a matter of course. In addition, in some cases, in order to make the description clearer, the widths, thicknesses, shapes and the like, of the respective parts are schematically illustrated in the drawings, compared to the actual modes. However, the schematic illustration is merely an example, and adds no restriction to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a direction X, a direction along the Y-axis is referred to as a direction Y, and a direction along the Z-axis is referred to as a direction Z. In addition, viewing various elements parallel to the direction Z is referred to as plan view.

The display device of the embodiment is an organic electroluminescent display device including an organic light emitting diode (OLED) as a display element, and can be mounted on televisions, personal computers, vehicle-mounted devices, tablet terminals, smartphones, cellphone terminals, and the like.

FIG. 1 is a view showing a configuration example of a display device DSP according to the embodiment. The display device DSP has a display area DA where images are displayed and a non-display area NDA around the display area DA, on an insulating base 10. The base 10 may be glass or a flexible resin film.

In the embodiment, a shape of the base 10 in plan view is a rectangular shape. However, the shape of the base 10 in plan view is not limited to a rectangular shape, but may also be other shape such as a square, a circle or an ellipse.

The display area DA includes a plurality of pixels PX arrayed in a matrix in the direction X and the direction Y. Each of the pixels PX includes a plurality of sub-pixels SP. As an example, the pixel PX includes a red sub-pixel SP1, a green sub-pixel SP2, and a blue sub-pixel SP3. The pixel PX may include a sub-pixel SP of the other color such as white, together with the sub-pixels SP1, SP2, and SP3. In addition, the pixel PX may include a sub-pixel SP of the other color instead of any of the sub-pixels SP1, SP2, and SP3.

The sub-pixel SP includes a pixel circuit 1 and a display element 20 driven by the pixel circuit 1. The pixel circuit 1 includes a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. Either of a source electrode and a drain electrode of the pixel switch 2 is connected to a signal line SL, and the other is connected to a gate electrode of the drive transistor 3, and the capacitor 4. In the drive transistor 3, either of the source electrode and the drain electrode is connected to a power line PL and the capacitor 4, and the other is connected to the display element 20.

The configuration of the pixel circuit 1 is not limited to the example shown in FIG. 1. For example, the pixel circuit 1 may include more thin-film transistors and capacitors.

The display element 20 is an organic light emitting diode (OLED) serving as a light emitting element. For example, the sub-pixel SP1 includes a display element 20 that emits light of a red wavelength range, the sub-pixel SP2 includes a display element 20 that emits light of a green wavelength range, and the sub-pixel SP3 includes a display element 20 that emits light of a blue wavelength range.

FIG. 1 mainly shows a display panel used for manufacturing the display device DSP, and the display device DSP has a structure in which a circuit board or the like including a driver (driver IC chip) which drives the display panel, and the like is connected to the display panel.

FIG. 2 shows an example of a layout of the sub-pixels SP1, SP2, and SP3. In the example shown in FIG. 2, the sub-pixels SP1 and SP2 are aligned in the direction Y. Furthermore, each of the sub-pixels SP1 and SP2 is arranged with the sub-pixel SP3 in the direction X.

When the sub-pixels SP1, SP2, and SP3 are arranged in the layout shown in FIG. 2, a row in which the sub-pixels SP1 and SP2 are alternately arranged in the direction Y and a row in which a plurality of sub-pixels SP3 are repeatedly arranged in the direction Y are formed in the display area DA. These rows are alternately arranged in the direction X.

The layout of the sub-pixels SP1, SP2, and SP3 is not limited to the example in FIG. 2. As another example, the sub-pixels SP1, SP2, and SP3 in each pixel PX may be arranged in order in the direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2. The partition 6 is arranged at the boundary between adjacent sub-pixels SP and overlaps with the rib 5 in plan view.

The partition 6 includes a plurality of first partitions 6x extending in the direction X and a plurality of second partitions 6y extending in the direction Y. The plurality of first partitions 6x are arranged between the apertures AP1 and AP2 adjacent in the direction Y and between two apertures AP3 adjacent in the direction Y. The second partitions 6y are arranged between the apertures AP1 and AP3 adjacent in the direction X and between the apertures AP2 and AP3 adjacent in the direction X.

In the example in FIG. 2, the first partitions 6x and the second partitions 6y are connected to each other. Thus, the partition 6 has a grating pattern surrounding the apertures AP1, AP2, and AP3 as a whole. The partition 6 is considered to include apertures at the sub-pixels SP1, SP2, and SP3, similarly to the rib 5.

In other words, in the embodiment, the rib 5 and the partition 6 are arranged to divide the sub-pixels SP1, SP2, and SP3.

The sub-pixel SP1 includes a lower electrode LE1, an upper electrode UE1, and an organic layer OR1 each overlapping with the aperture AP1. The sub-pixel SP2 includes a lower electrode LE2, an upper electrode UE2, and an organic layer OR2 each overlapping with the aperture AP2. The sub-pixel SP3 includes a lower electrode LE3, an upper electrode UE3, and an organic layer OR3 each overlapping with the aperture AP3. In the example shown in FIG. 2, outer shapes of the upper electrode UE1 and the organic layer OR1 correspond to each other, outer shapes of the upper electrode UE2 and the organic layer OR2 correspond to each other, and outer shapes of the upper electrode UE3 and the organic layer OR3 correspond to each other.

The lower electrode LE1, the upper electrode UE1, and the organic layer OR1 constitute the display element 20 of the sub-pixel SP1. The lower electrode LE2, the upper electrode UE2, and the organic layer OR2 constitute the display element 20 of the sub-pixel SP2. The lower electrode LE3, the upper electrode UE3, and the organic layer OR3 constitute the display element 20 of the sub-pixel SP3.

The lower electrode LE1 is connected to the pixel circuit 1 which drives (the display element 20 of) the sub-pixel SP1 through a contact hole CH1. The lower electrode LE2 is connected to the pixel circuit 1 which drives (the display element 20 of) the sub-pixel SP2 through a contact hole CH2. The lower electrode LE3 is connected to the pixel circuit 1 which drives (the display element 20 of) the sub-pixel SP3 through a contact hole CH3.

In the example of FIG. 2, the contact holes CH1 and CH2 entirely overlap with the first partition 6x between the apertures AP1 and AP2 adjacent to each other in the direction Y. The contact hole CH3 entirely overlaps with the first partition 6x between two apertures AP3 adjacent in the direction Y. As an alternative example, at least parts of the contact holes CH1, CH2, and CH3 may not overlap with the first partition 6x.

In the example shown in FIG. 2, the lower electrodes LE1 and LE2 include protrusions PR1 and PR2, respectively. The protrusion PR1 protrudes from the body of the lower electrode LE1 (the portion overlapping with the aperture AP1) toward the contact hole CH1. The protrusion PR2 protrudes from the body of the lower electrode LE2 (the portion overlapping with the aperture AP2) toward the contact hole CH2. The contact holes CH1 and CH2 overlap with the protrusions PR1 and PR2, respectively.

Figure 3:
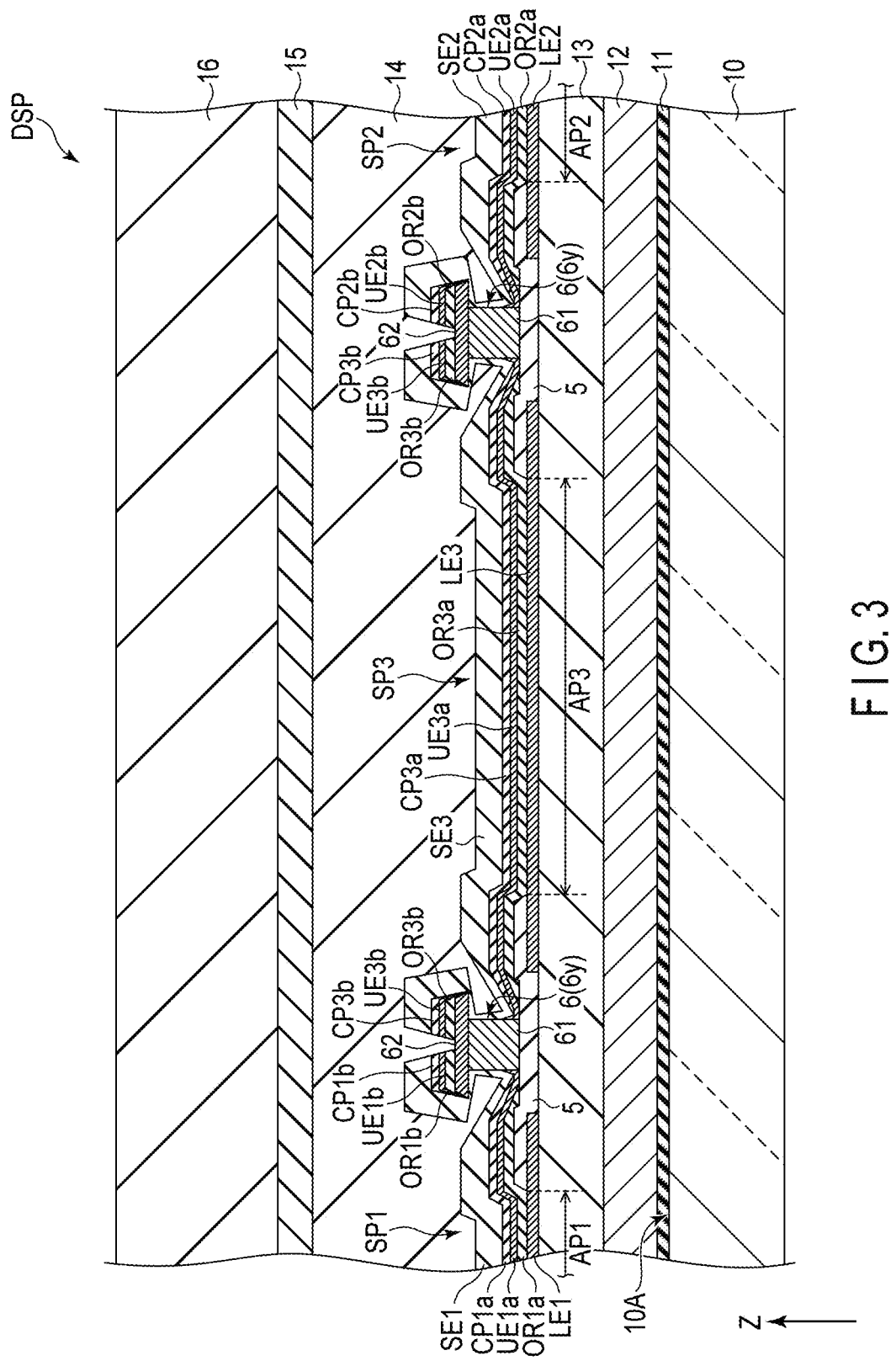
FIG. 3 is a schematic cross-sectional view showing the display device along line III-III in FIG. 2.

FIG. 3 is a schematic cross-sectional view showing the display device DSP along line III-III in FIG. 2. In the display device DSP, an insulating layer 11 referred to as an undercoat layer is arranged on a first surface 10A of the base 10 (i.e., on the surface of the side where the display element 20 and the like are arranged).

The insulating layer 11 has, for example, a three-layer stacked structure with a silicon oxide film (SiO), a silicon nitride film (SiN), and a silicon oxide film (SiO). The insulating layer 11 is not limited to the three-layer stacked structure, but may have a stacked structure with more than three layers, or may have a single-layer structure or a two-layer stacked structure.

A circuit layer 12 is arranged on the insulating layer 11. The circuit layer 12 includes various circuits and wires that drive the sub-pixels SP (SP1, SP2, and SP3) of the pixel circuit 1, the scanning line GL, the signal line SL, the power line PL, and the like shown in FIG. 1. The circuit layer 12 is covered with an insulating layer 13.

The insulating layer 13 functions as a planarization film which planarizes uneven parts generated by the circuit layer 12. Although not shown in FIG. 3, the above-described contact holes CH1, CH2, and CH3 are provided in the insulating layer 13.

The lower electrodes LE (LE1, LE2, and LE3) are arranged on the insulating layer 13. The rib 5 is arranged on the insulating layer 13 and the lower electrodes LE. End portions (parts) of the lower electrodes LE are covered with the rib 5.

The partition 6 includes a lower portion 61 arranged on the rib 5 and an upper portion 62 that covers an upper surface of the lower portion 61. The upper portion 62 has a greater width in direction X and direction Y than the lower portion 61. As a result, the partition 6 has a shape in which both ends of the upper portion 62 protrude beyond side surfaces of the lower portion 61. This shape of the partition 6 may also be referred to as an overhung shape.

The organic layers OR (OR1, OR2, and OR3) and the upper electrodes UE (UE1, UE2, and UE3) constitute the display element 20 together with the above-described lower electrodes LE (LE1, LE2, and LE3) but, as shown in FIG. 3, the organic layer OR1 includes a first organic layer OR1a and a second organic layer OR1b that are separated from each other. The upper electrode UE1 includes a first upper electrode UE1a and a second upper electrode UE1b that are separated from each other. The first organic layer OR1a is in contact with the lower electrode LE1 through the aperture AP1 and covers a part of the rib 5. The second organic layer OR1b is located on the upper portion 62. The first upper electrode UE1a is opposed to the lower electrode LE1 and covers the first organic layer OR1a. Furthermore, the first upper electrode UE1a is in contact with side surfaces of the lower portion 61. The second upper electrode UE1b is located above the partition 6 and covers the second organic layer OR1b.

In addition, as shown in FIG. 3, the organic layer OR2 includes a first organic layer OR2a and a second organic layer OR2b that are separated from each other. The upper electrode UE2 includes a first upper electrode UE2a and a second upper electrode UE2b that are separated from each other. The first organic layer OR2a is in contact with the lower electrode LE2 through the aperture AP2 and covers a part of the rib 5. The second organic layer OR2b is located on the upper portion 62. The first upper electrode UE2a is opposed to the lower electrode LE2 and covers the first organic layer OR2a. Furthermore, the first upper electrode UE2a is in contact with side surfaces of the lower portion 61. The second upper electrode UE2b is located above the partition 6 and covers the second organic layer OR2b.

In addition, as shown in FIG. 3, the organic layer OR3 includes a first organic layer OR3a and a second organic layer OR3b that are separated from each other. The upper electrode UE3 includes a first upper electrode UE3a and a second upper electrode UE3b that are separated from each other. The first organic layer OR3a is in contact with the lower electrode LE3 through the aperture AP3 and covers a part of the rib 5. The second organic layer OR3b is located on the upper portion 62. The first upper electrode UE3a is opposed to the lower electrode LE3 and covers the first organic layer OR3a. Furthermore, the first upper electrode UE3a is in contact with the side surfaces of the lower portion 61. The second upper electrode UE3b is located above the partition 6 and covers the second organic layer OR3b.

In the example shown in FIG. 3, the sub-pixels SP1, SP2, and SP3 include cap layers CP1, CP2, and CP3 for adjusting the optical property of the light emitted from light emitting layers of the respective organic layers OR1, OR2, and OR3.

The cap layer CP1 includes a first cap layer CP1a and a second cap layer CP1b that are separated from each other. The first cap layer CP1a is located in the aperture AP1 and is arranged on the first upper electrode UE1a. The second cap layer CP1b is located above the partition 6 and is arranged on the second upper electrode UE1b.

The cap layer CP2 includes a first cap layer CP2a and a second cap layer CP2b that are separated from each other. The first cap layer CP2a is located in the aperture AP2 and is arranged on the first upper electrode UE2a. The second cap layer CP2b is located above the partition 6 and is arranged on the second upper electrode UE2b.

The cap layer CP3 includes a first cap layer CP3a and a second cap layer CP3b that are separated from each other. The first cap layer CP3a is located in the aperture AP3 and is arranged on the first upper electrode UE3a. The second cap layer CP3b is located above the partition 6 and is arranged on the second upper electrode UE3b.

Sealing layers SE1, SE2, and SE3 are provided in the sub-pixels SP1, SP2, and SP3, respectively. The sealing layer SE1 continuously covers the members of the sub-pixel SP1 including the first cap layer CP1a, the partition 6, and the second cap layer CP1b. The sealing layer SE2 continuously covers the members of the sub-pixel SP2 including the first cap layer CP2a, the partition 6, and the second cap layer CP2b. The sealing layer SE3 continuously covers the members of the sub-pixel SP3 including the first cap layer CP3a, the partition 6, and the second cap layer CP3b.

In the example shown in FIG. 3, the second organic layer OR1b, the second upper electrode UE1b, the second cap layer CP1b, and the sealing layer SE1 on the partition 6 between the sub-pixels SP1 and SP3 are separated from the second organic layer OR3b, the second upper electrode UE3b, the second cap layer CP3b, and the sealing layer SE3 on the partition 6. In addition, the second organic layer OR2b, the second upper electrode UE2b, the second cap layer CP2b, and the sealing layer SE2 on the partition 6 between the sub-pixels SP2 and SP3 are separated from the second organic layer OR3b, the second upper electrode UE3b, the second cap layer CP3b, and the sealing layer SE3 on the partition 6.

The sealing layers SE1, SE2, and SE3 are covered with a resin layer 14. The resin layer 14 is covered with a sealing layer 15. Furthermore, the sealing layer 15 is covered with a resin layer 16.

The insulating layer 13 and the resin layers 14 and 16 are formed of organic materials. The rib 5, the sealing layer 15, and SE (SE1, SE2, and SE3) are formed of, for example, an inorganic material such as silicon nitride (SiNx).

The lower portion 61 of the partition 6 is conductive. The upper portion 62 of the partition 6 may also be conductive. The lower electrode LE may be formed of a transparent conductive oxide such as indium tin oxide (ITO) or may have a stacked structure of a metal material such as silver (Ag) and a conductive oxide. The upper electrode UE is formed of, for example, a metallic material such as an alloy (MgAg) of magnesium and silver. The upper electrode UE may be formed of a conductive oxide such as ITO.

When the potential of the lower electrode LE is relatively higher than the potential of the upper electrode UE, the lower electrode corresponds to an anode, and the upper electrode UE corresponds to a cathode. In addition, when the potential of the upper electrode UE is relatively higher than that of the lower electrode LE, the upper electrode UE corresponds to an anode, and the lower electrode LE corresponds to a cathode.

The organic layer OR includes a pair of functional layers, and a light emitting layer arranged between these functional layers. As an example, the organic layer OR has a structure in which a hole-injection layer, a hole-transport layer, an electron blocking layer, a light emitting layer, a hole blocking layer, an electron-transport layer, and an electron-injection layer are stacked in this order.

The cap layer CP (CP1, CP2, and CP3) is formed of, for example, a multilayer body of a plurality of transparent thin films. As the plurality of thin films, the multilayer body may include a thin film formed of an inorganic material and a thin film formed of an organic material. In addition, these thin films have refractive indices different from each other. The materials of the thin films constituting the multilayer body are different from the materials of the upper electrode UE and are also different from the materials of the sealing layer SE. The cap layer CP may be omitted.

A common voltage is supplied to the partition 6. This common voltage is supplied to each of the upper electrodes UE (first upper electrodes UE1a, UE2a, and UE3a) that are in contact with the side surfaces of the lower portion 61. A pixel voltage is supplied to the lower electrode LE (LE1, LE2, and LE3) through the pixel circuit 1 included in each sub-pixel SP (SP1, SP2, and SP3).

When a potential difference is formed between the lower electrode LE1 and the upper electrode UE1, the light emitting layer of the first organic layer OR1a emits light of the red wavelength range. When a potential difference is formed between the lower electrode LE2 and the upper electrode UE2, the light emitting layer of the first organic layer OR2a emits light of the green wavelength range. When a potential difference is formed between the lower electrode LE3 and the upper electrode UE3, the light emitting layer of the first organic layer OR3a emits light of the blue wavelength range.

As another example, the light emitting layers of the organic layers OR1, OR2, and OR3 may emit light of the same color (for example, white). In this case, the display device DSP may include a color filter that converts the light emitted from the light emitting layers into light of the color corresponding to the sub-pixels SP1, SP2, and SP3. In addition, the display device DSP may include a layer including quantum dots that are excited by the light emitted from the light emitting layers to generate the light of the colors corresponding to the sub-pixels SP1, SP2, and SP3.

Figure 4:
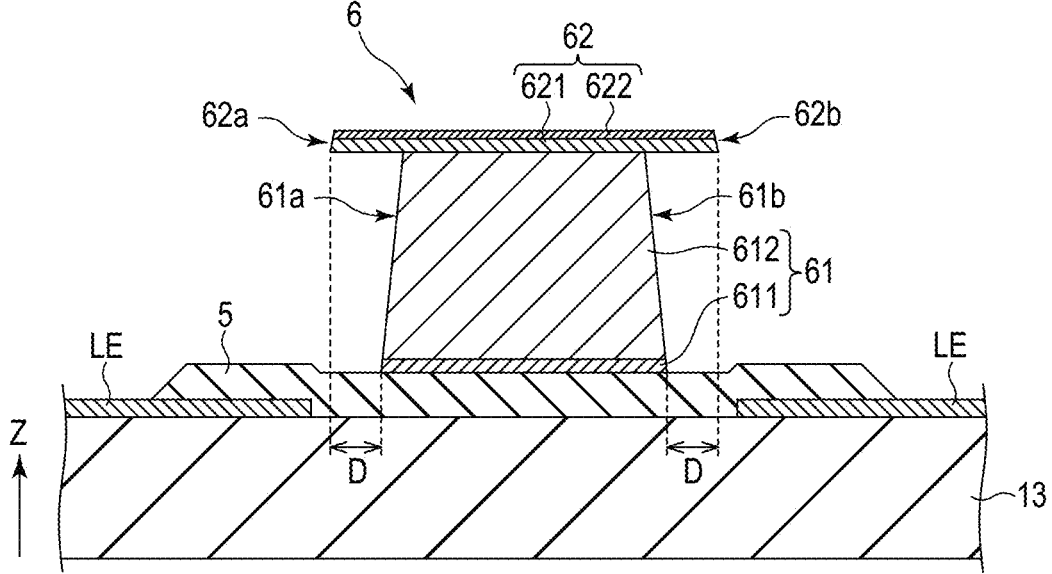
FIG. 4 is a schematic cross-sectional view showing a partition.

FIG. 4 is a schematic enlarged cross-sectional view of the partition 6. In FIG. 4, the elements other than the rib 5, the partition 6, the insulating layer 12 and a pair of lower electrodes LE are omitted. The pair of lower electrodes LE correspond to any of the above-described lower electrodes LE1, LE2, or LE3. In addition, the first partition 6x and the second partition 6y described above have the same structure as the partition 6 shown in FIG. 4.

In the example shown in FIG. 4, the lower portion 61 of the partition 6 includes a barrier layer 611 arranged on the rib 5, and a metal layer 612 arranged on the barrier layer 611. The barrier layer 611 is formed of a material different from the metal layer 612, for example, a metal material such as molybdenum. The metal layer 612 is formed to be thicker than the barrier layer 611. The metal layer 612 may have a single-layer structure or a multilayer structure of different metal materials. As an example, the metal layer 612 is formed of, for example, aluminum (Al) or an aluminum alloy.

The upper portion 62 is thinner than the lower portion 61. In the example shown in FIG. 4, the upper portion 62 includes a first layer 621 arranged on the metal layer 612, and a second layer 622 arranged on the first layer 621. As an example, the first layer 621 is formed of, for example, titanium (Ti) and the second layer 622 is formed of, for example, ITO. It has been described that the upper portion 62 has a two-layer stacked structure, but the upper portion 62 may have a single-layer structure formed of, for example, a metal material such as titanium. In addition, the upper portion 62 may also be formed of a material other than a metal material, and may be formed of an inorganic material such as silicon oxide (SiO). Furthermore, the upper portion 62 may be formed by stacking an appropriate combination of the conductive oxide such as ITO, the metal material such as titanium, and the inorganic material such as silicon oxide, which have been described above, or may be formed of a single layer of any of the above-described materials.

In the example shown in FIG. 4, the width of the lower portion 61 becomes smaller toward the upper portion 62. In other words, the side surfaces 61a and 61b of the lower portion 61 are inclined to the direction Z. The upper portion 62 includes an end portion 62a protruding from the side surface 61a and an end portion 62b protruding from the side surface 61b.

An amount D by which the end portions 62a and 62b protrude from the side surfaces 61a and 61b (hereinafter referred to as an amount of protrusion D of the partition 6) is, for example, 2.0 µm or less. The amount of protrusion D of the partition 6 in the embodiment corresponds to a length (distance) in the width direction (direction X or direction Y) orthogonal to the direction Z of the partition 6, between a lower end (barrier layer 611) of the sides 61a and 61b, and the end portions 62a and 62b.

The structure of the partition 6 and the materials of each part of the partition 6 may be selected as appropriate by considering, for example, a method of forming the partition 6, and the like.

In the embodiment, the partition 6 is formed to divide the sub-pixels SP in plan view. The above-described organic layer OR is formed by, for example, anisotropic or directional vacuum evaporation but, when the organic material for forming the organic layer OR is evaporated over the entire base 10 in a state in which the partition 6 is arranged, the organic layer OR is hardly formed on the side surfaces of the partition 6 since the partition 6 has the shape shown in FIG. 3 and FIG. 4. According to this, the organic layer OR (display element 20) which is divided for each sub-pixel SP by the partition 6 can be formed.

Figure 7:
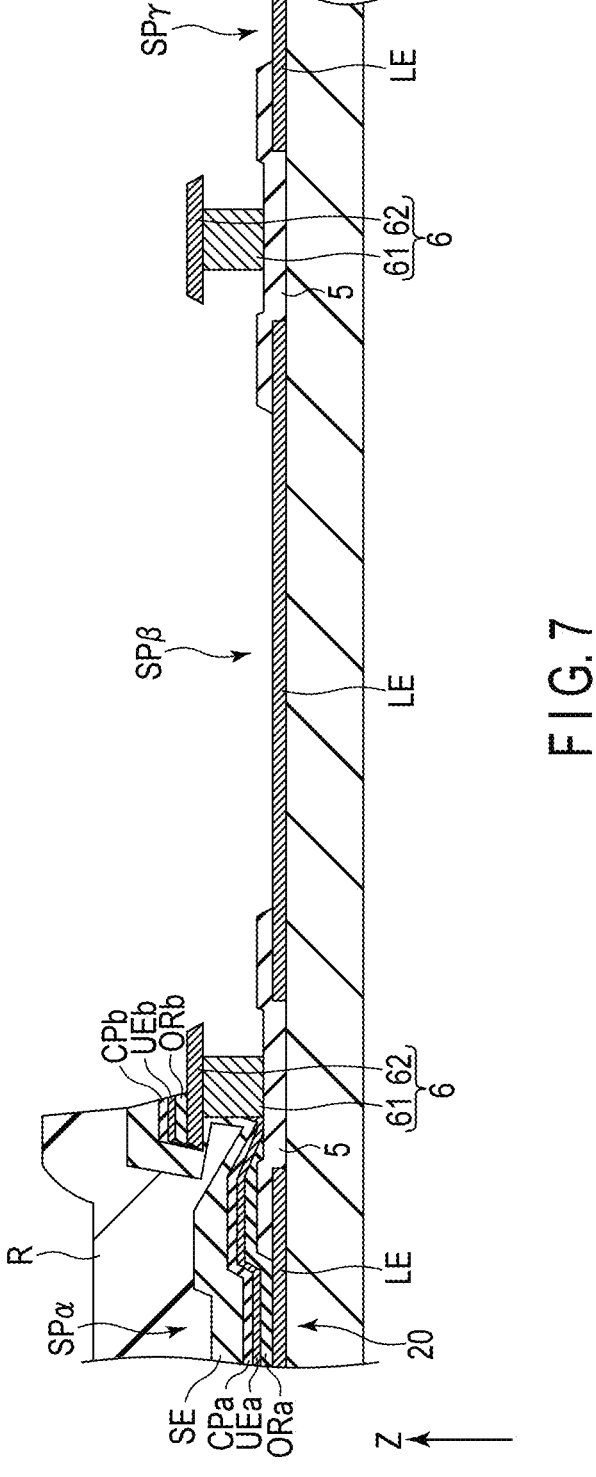
FIG. 7 is a schematic cross-sectional view illustrating the display element formed using the partition.

FIG. 5 to FIG. 7 are schematic cross-sectional views illustrating the display element 20 formed using the partition 6. Each of sub-pixels SPα, SPβ, and SPγ shown in FIG. 5 to FIG. 7 corresponds to one of the sub-pixels SP1, SP2, and SP3.

In a state in which the partition 6 is arranged as described above, the organic layer OR, the upper electrode UE, the cap layer CP, and the sealing layer SE are formed in order on the entire base 10 by vapor deposition as shown in FIG. 5. The organic layer OR includes a light emitting layer which emits light of a color corresponding to the sub-pixel SPα. The organic layer OR is divided into a first organic layer ORa which covers the lower electrode LE and a second organic layer ORb on the partition 6, the upper electrode UE is divided into a first upper electrode UEa which covers the first organic layer ORa and a second upper electrode UEb which covers the second organic layer ORb, and the cap layer CP is divided into a first cap layer CPa which covers the first upper electrode UEa and a second cap layer CPb which covers the second upper electrode UEb, by the partition 6 in the overhung shape. The first upper electrode UEa is in contact with the lower portion 61 of the partition 6. The sealing layer SE continuously covers the first cap layer CPa, the second cap layer CPb, and the partition 6.

Next, a resist R is formed on the sealing layer SE as shown in FIG. 6. The resist R covers the sub-pixel SPα. In other words, the resist R is arranged directly above the first organic layer ORa, the first upper electrode UEa, and the first cap layer CPa, which are located in the sub-pixel SPα. The resist R is also located directly above portions close to the sub-pixel SPα, of the second organic layer ORb, the second upper electrode UEb, and the second cap layer CPb on the partition 6 between the sub-pixel SPα and the sub-pixel SPβ. In other words, at least a part of the partition 6 is exposed from the resist R.

Furthermore, portions exposed from the resist R, of the organic layer OR, the upper electrode UE, the cap layer CP and the sealing layer SE, are removed as shown in FIG. 7, by etching using the resist R as a mask. The display element 20 including the lower electrode LE, the first organic layer ORa, the first upper electrode UEa, and the first cap layer CPa is thereby formed in the sub-pixel SPα. In contrast, the lower electrode LE is exposed in the sub-pixels SET, and SPγ. The above-described etching includes, for example, dry etching of the sealing layer SE, wet etching and dry etching of the cap layer CP, wet etching of the upper electrode UE, and dry etching of the organic layer OR.

When the display element 20 of the sub-pixel SPα is formed as described above, the resist R is removed, and the display elements 20 of the sub-pixels SET, and SPγ are formed in order similarly to the sub-pixel SPα.

The display elements 20 of the sub-pixels SP1, SP2, and SP3 are formed, and the resin layer 14, the sealing layer 15, and the resin layer 16 are formed, as exemplified for the above sub-pixels SPα, SPβ, and SPγ, and the structure of the display device DSP shown in FIG. 3 is thereby implemented.

As described above, the partition 6 includes the lower portion 61 and the upper portion 62 protruding from the side surface of the lower portion 61 but, if the amount of protrusion D (eave width) of the partition 6 is not appropriate, the reliability of the display device DSP may be reduced.

More specifically, the display device DSP is configured such that the organic layer OR is divided for each sub-pixel SP by the partition 6 and, if the amount of protrusion D is not sufficiently larger than the designed value, the organic layer OR may not be able to be appropriately divided. In addition, if the side surface of the lower portion 61 of the partition 6 is covered with the organic layer OR, the electric connection between the lower portion 61 and the upper electrode UE is inhibited. In contrast, the upper electrode UE is in contact with the side surface of the lower portion 61 of the partition 6, in the display device DSP but, if the amount of protrusion D of the partition 6 exceeds the designed value, the upper electrode UE may not be in contact with the side surface of the lower portion 61.

In other words, since a highly reliable display device DSP cannot be manufactured in a case where the above-described amount of protrusion D of the partition 6 is not appropriate, it is useful to measure the amount of protrusion D (i.e., the length between the side surface of the lower portion 61 of the partition 6 and the end portion of the upper portion 62) in the process of manufacturing the display device DSP.

Using, for example, an optical microscope capable of observing an expanded image of an object for the measurement of the above-described amount of protrusion D of the partition 6 will be considered here.

Figure 8:
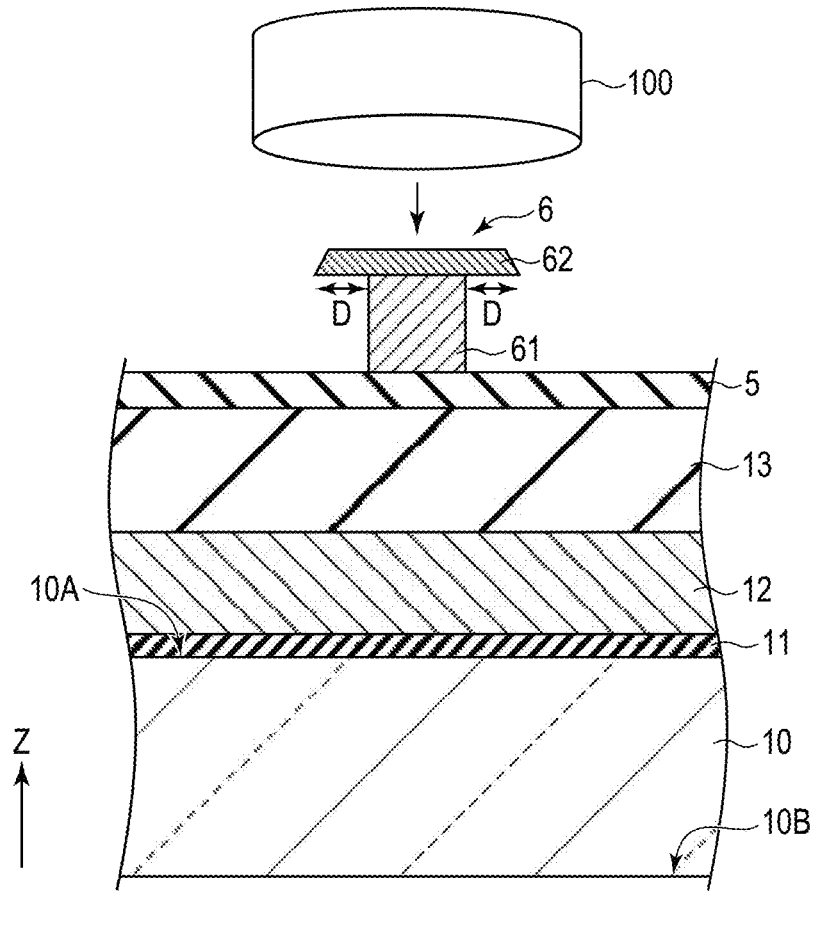
FIG. 8 is a view illustrating measurement of an amount of protrusion of the partition.

First, measuring the amount of protrusion D of the partition 6 by observing the partition 6 from the direction Z (i.e., the first surface side of the base 10) by using the optical microscope 100 when the partition 6 is formed as shown in FIG. 8 is assumed. In this case, since the upper portion 62 of the partition 6 has a width larger than the lower portion 61 (i.e., the shape of the partition 6 is the overhung shape), the side surface of the lower portion 61 (i.e., the end portion of the lower portion 61 in the direction X or the direction Y) cannot be observed by the optical microscope 100 when, for example, the upper portion 62 includes a layer formed of a transparent metal material having no optical transparency (for example, titanium). In other words, when the partition 6 is observed from the direction Z as shown in FIG. 8, the length (width) of the upper portion 62 in the direction X and the direction Y can be measured, but the amount of protrusion D of the partition 6 cannot be measured.

Figure 9:
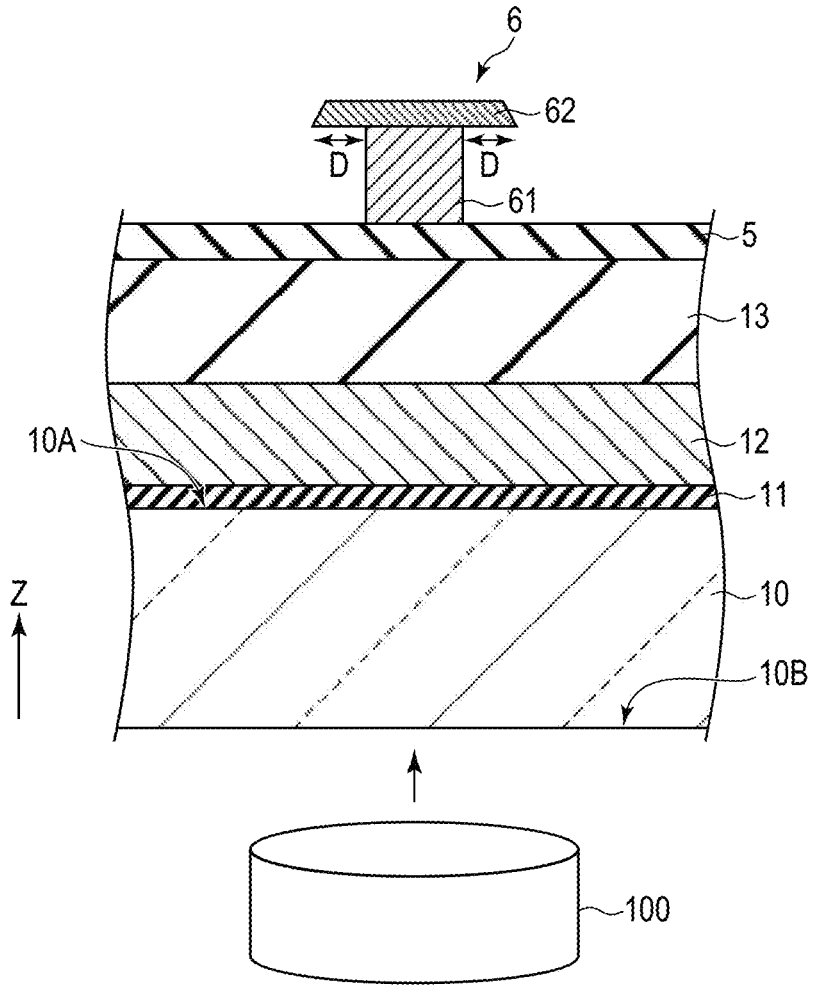
FIG. 9 is a view illustrating measurement of an amount of protrusion of the partition.

For this reason, in the embodiment, the amount of protrusion D of the partition 6 is measured by observing the partition 6 from a direction opposite to the direction Z (i.e., the second surface 10B side opposed to the first surface 10A of the base 10) by using the optical microscope 100, as shown in FIG. 9.

The above-described optical microscope 100 shown in FIG. 8 and FIG. 9 is schematically illustrated to describe the direction of mainly observing the partition 6, and the structure and the like of the optical microscope 100 are not illustrated.

Incidentally, the above-described optical microscope 100 includes a function to output an image including an object (for example, the partition 6) observed by the optical microscope 100. FIG. 10 shows an example of an image (hereinafter referred to as a microscopic image) including the partition 6 observed by the optical microscope 100 in the direction opposite to the direction Z. In addition, FIG. 11 shows an image expanding an area 200 of a part of the microscopic image shown in FIG. 10.

FIG. 2 described above shows the sub-pixels SP1, SP2, and SP3 seen from the direction Z, but FIG. 10 shows the sub-pixels SP1, SP2, and SP3 seen from a direction opposite to the direction Z. For this reason, the arrangement of the sub-pixels SP1, SP2, and SP3 shown in FIG. 10 is inversed with respect to the Y-axis as compared to the sub-pixels SP1, SP2, and SP3 shown in FIG. 2.

In addition, FIG. 10 and FIG. 11 show only the partition 6 (i.e., the lower portion 61 and the upper portion 62) and the sub-pixels SP1, SP2, and SP3 divided by the partition 6 for convenience for description.

According to FIG. 10 and FIG. 11, for example, since the side surface of the lower portion 61 of the partition 6 and the end portion of the upper portion 62 are included in the microscopic image, the amount of protrusion D of the partition 6 can be measured by designating a width 201 (width in the X direction) of the lower portion 61 and a width 202 (width in the X direction) of the upper portion 62. More specifically, the amount of protrusion D of the partition 6 can be measured (calculated) by "(width 202 of upper portion 62–width 201 of lower portion 61)×½".

However, although not shown in FIG. 10 FIG. 11 for convenience for description, when the partition 6 (i.e., the lower portion 61 and the upper portion 62) is observed from a direction opposite to the direction Z by the optical microscope 100, the microscopic image including the partition 6 may be unclear due to, for example, an influence from the base (glass base). In addition, the insulating layer 11, the circuit layer 12, the insulating layer 13, and the rib 5 are arranged between the base 10 and the partition 6, and these may also be factors for decreasing the visibility of the partition 6 included in the microscopic image.

For this reason, manually performing the measurement of the amount of protrusion D of the partition 6 (i.e., for example, designation of the width 201 of the lower portion 61 and the width 202 of the upper portion 62 in the microscopic image, and the like) by referring to such a microscopic image requires much labor, and efficient measurement of the amount of protrusion D of the partition 6 in the process of manufacturing the display device DSP cannot be realized.

Therefore, the embodiment proposes a system of automatically measuring the amount of protrusion D of the partition 6, using the microscopic image including the partition 6 observed from the direction opposite to the direction Z (i.e., the second surface 10B side of the base 10) by the optical microscope 100 as described above. In the embodiment, the amount of protrusion D of the partition 6 is assumed to be measured by a measurement device which is communicably connected to the optical microscope 100. The measurement device may be realized integrally with the optical microscope 100.

Figure 12:
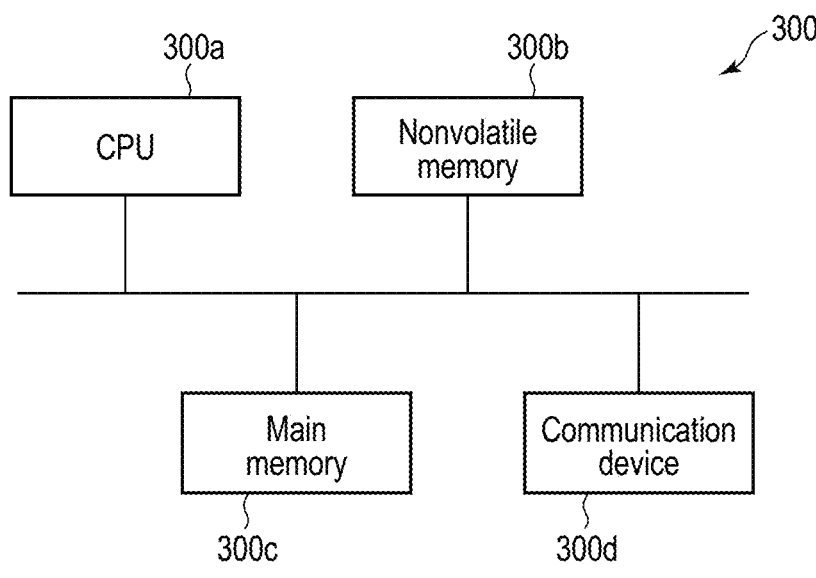
FIG. 12 is a view showing an example of a hardware configuration of a measurement device.

The measurement device of the embodiment will be described below. FIG. 12 shows an example of a hardware configuration of the measurement device.

A measurement device 300 shown in FIG. 12 is realized by, for example, a personal computer and includes a CPU 300a, a nonvolatile memory 300b, a main memory 300c, a communication device 300d, and the like.

The CPU 300a is a processor for controlling the operation of the measurement device 300 and executes various programs that are loaded from the nonvolatile memory 300b into the main memory 300c. The communication device 300d executes communication with external devices (for example, the optical microscope 100, and the like) of the measurement device 300.

Figure 13:
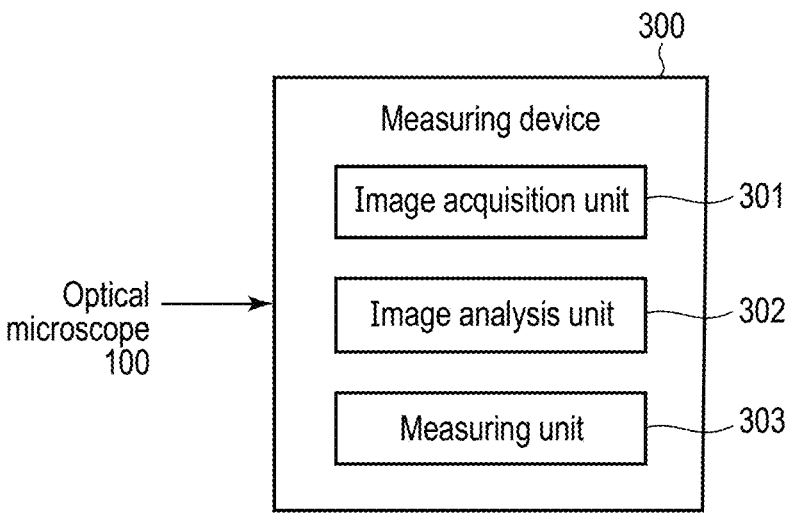
FIG. 13 is a view showing an example of a functional configuration of the measurement device.

FIG. 13 is a view showing an example of a functional configuration of the measurement device 300. As shown in FIG. 13, the measurement device 300 includes an image acquisition unit 301, an image analysis unit 302, and a measurement unit 303.

Some or all of the units 301 to 303 included in the measurement device 300 are functional units realized by the above-described CPU 300a (i.e., the computer of the measurement device 300) executing predetermined programs (i.e., software), but may be realized by hardware such as an integrated circuit (IC) and the like or by a combination of software and hardware.

In the embodiment, the measurement device 300 is communicably connected to the optical microscope 100, and the image acquisition unit 301 acquires microscopic images including the partition 6 observed by the optical microscope 100 from the optical microscope 100. The image analysis unit 302 analyzes the microscopic images acquired by the image acquisition unit 301. The measuring unit 303 measures the amount of protrusion D of the partition 6 formed on the above-described base 10 (i.e., a length from the side surface of the lower portion 61 of the partition 6 to the end portion of the upper portion 62), based on the analysis results of the image analyzing unit 302.

An example of the processing procedure of the measurement device 300 of the embodiment will be described below with reference to a flowchart of FIG. 14.

First, when the insulating layer 11, the circuit layer 12, the insulating layer 13, the lower electrode LE, the rib 5, and the partition 6 are formed on the base 10, the partition 6 is observed from the second surface 10B side of the base 10 (i.e., the surface on the side where the display element 20 and the like are not arranged), by the optical microscope 100. In this case, the optical microscope 100 generates the microscopic image including the partition 6 observed by the optical microscope 100 (i.e., an expanded image of the partition 6 which can be visually recognized), and outputs the generated microscopic image to the measuring device 300. In the embodiment, the microscopic image (image file) is assumed to be in, for example, a file format such as jpeg, but may be a file in any other format.

The microscopic image output from the optical microscope 100 as described above is acquired by the image acquisition unit 301 in the measurement device 300 (step S1).

When the process of step S1 is executed, the image analysis unit 302 extracts an area (hereinafter referred to as a to-be-measured area) for measurement of the amount of protrusion D of the partition 6 from the microscopic image acquired in step S1 (step S2).

In the embodiment, since the length between the side surface of the lower portion 61 and the end portion of the upper portion 62 in the partition 6 needs to be measured as the amount of protrusion D of the partition 6, the to-be-measured area extracted from the microscopic image in step S2 is assumed to be at least an area including the side surface of the lower portion 61 and the end portion of the upper portion 62, which are arranged in the direction X or the direction Y.

The to-be-measured area may be, for example, an area specified based on preliminarily designated coordinate values in the microscopic image (i.e., an area at a preliminarily determined position) or an area specified based on the arrangement of the sub-pixels SP1, SP2, and SP3 recognized by executing a predetermined image process for the microscopic image.

The above-described microscopic image acquired in step S1 (i.e., the to-be-measured area extracted from the microscopic image in step S2) is composed of a plurality of pixels, and each of the pixels holds a luminance value (pixel value) for displaying the microscopic image. Therefore, the image analysis unit 302 acquires from the microscopic image acquired in step S2 the luminance value held by each of the plurality of pixels constituting the to-be-measured area (hereinafter simply referred to as a luminance value of a pixel) (step S3).

Next, the image analysis unit 302 identifies a pixel (hereinafter referred to as a first pixel) corresponding to (the end portion on the base 10 side of) the side surface of the lower portion 61 included in the to-be-measured area (microscopic image), and a pixel (hereinafter referred to as a second pixel) corresponding to the end portion of the upper portion 62, based on the luminance values of the plurality of pixels acquired in step S3 (step S4). The process of step S4 corresponds to the process of identifying coordinate values of the side surface of the lower portion 61 and coordinates of the end portion of the upper portion 62, in the to-be-measured area.

When the process of step S4 is executed, the image analysis unit 302 refers to the to-be-measured area extracted in step S2 to acquire (count) the number of pixels arranged between the first and second pixels identified in step S4 (step S5).

The above-described processes of steps S2 to S5 will be specifically described below with reference to FIG. 15 and FIG. 16.

Figure 15:
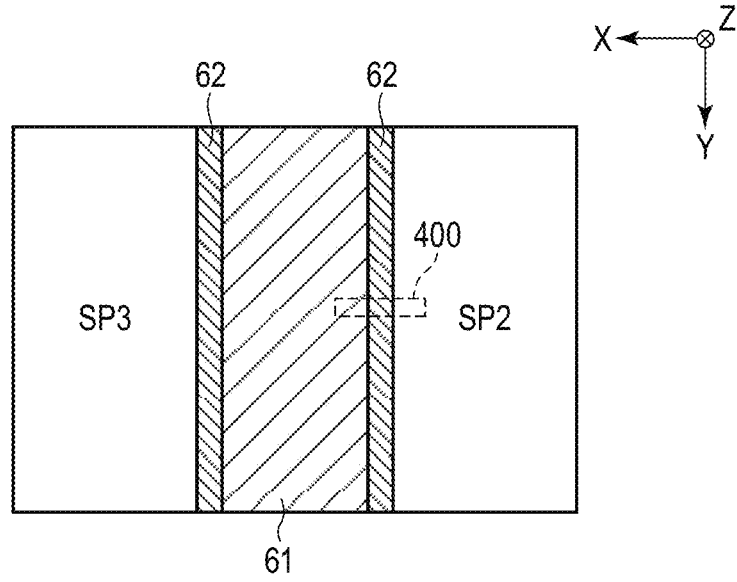
FIG. 15 is a view showing an example of a to-be-measured area extracted from a microscopic image.

First, FIG. 15 shows an example of the to-be-measured area extracted from the microscopic image in step S2. A to-be-measured area 400 including a boundary between the upper portion 62 and the sub-pixel SP3 and a boundary between the lower portion 61 and the upper portion 62, which are arranged in the direction X in the microscopic image (i.e., the image shown in FIG. 11), is shown in FIG. 15. The to-be-measured area 400 shown in FIG. 15 is assumed to be an area composed of, for example, fifty pixels aligned in the X direction.

Next, FIG. 16 shows an example of luminance values of a plurality of pixels constituting the to-be-measured area 400 acquired in step S3. When the to-be-measured area 400 is assumed to be an area composed of fifty pixels as described above, FIG. 16 shows luminance values of fifteenth to thirty-first pixels, of fifty pixels constituting the to-be-measured area 400, in table format. The luminance values of the pixels include luminance values corresponding to red (R), luminance values corresponding to green (G), and luminance values corresponding to blue (B).

Figure 17:
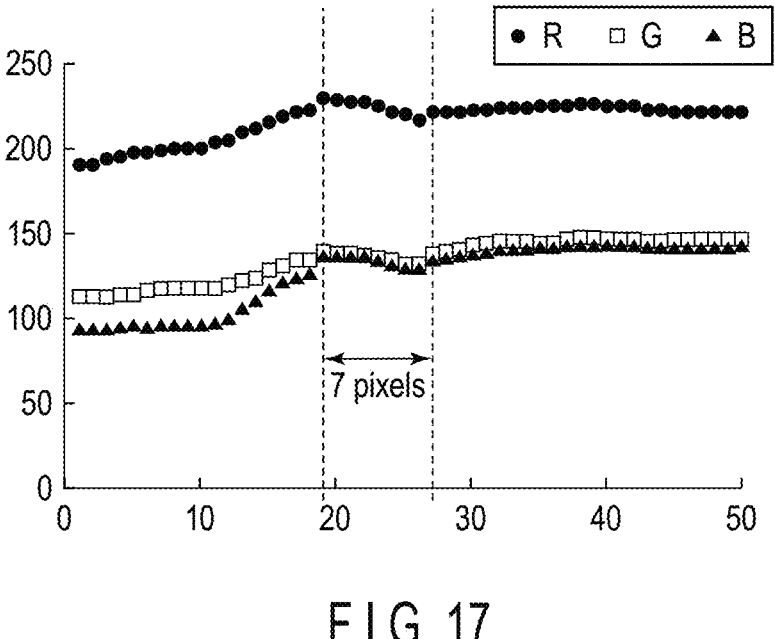
FIG. 17 is a graph illustrating conversion information generated based on a first standard sample image.

According to the luminance values of fifty pixels shown in FIG. 16 and FIG. 17, for example, since the luminance value of the nineteenth pixel has a comparatively large amount of change from the luminance value of the eighteenth pixel, the nineteenth pixel can be identified as the second pixel corresponding to (the boundary between the second sub-pixel SP2 and) the end portion of the upper portion 62 in step S4. Furthermore, according to the luminance values of fifty pixels shown in FIG. 16 and FIG. 17, for example, since the luminance value of the twenty-seventh pixel has a comparatively large amount of change from the luminance value of the twenty-sixth pixel, the twenty-seventh pixel can be identified as the first pixel corresponding to (the boundary between the upper portion 62 and) the side surface of the lower portion 61 in step S4.

In step S4, for example, the pixels in which the amount of change in luminance value from the adjacent pixel is more than or equal to a predetermined value can be identified as the first and second pixels, but the first and second pixels may be identified based on the amount of change of one of the luminance value corresponding to red, the luminance value corresponding to green, and the luminance value corresponding to blue or may be identified based on a total value (or an average value) of the luminance value corresponding to red, the luminance value corresponding to green, and the luminance value corresponding to blue.

When the nineteenth pixel of fifty pixels constituting the to-be-measured area 400 is identified as the second pixel and the twenty-seventh pixel is identified as the first pixel in step S4 as described above, 7 is acquired as the number of pixels arranged between the first and second pixels in step S5.

Figure 14:
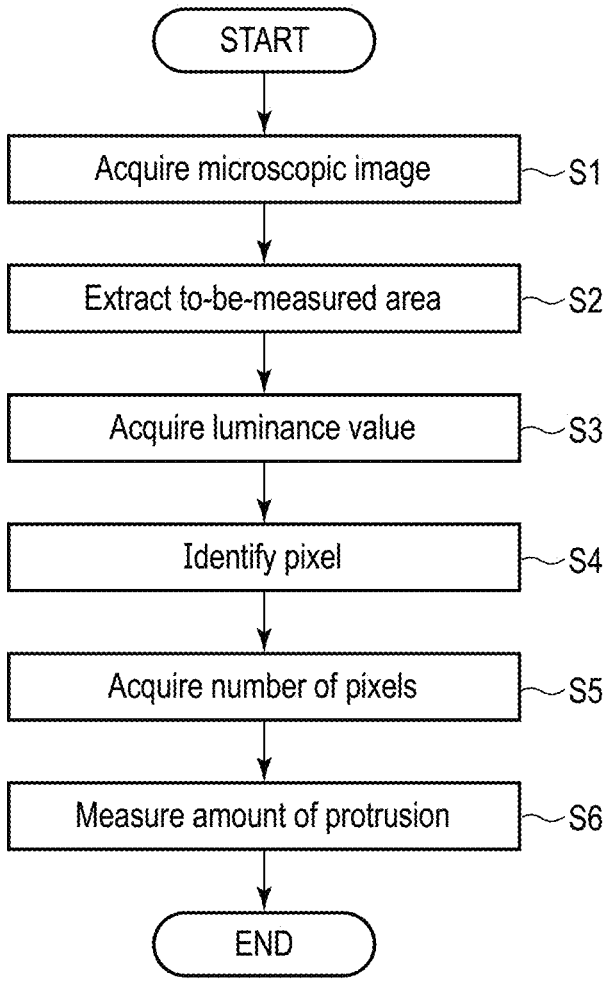
FIG. 14 is a flowchart showing an example of a processing procedure of the measurement device.

With reference to FIG. 14, the measuring unit 303 measures the amount of protrusion D of the partition 6, based on the number of pixels acquired in step S5 (step S6).

In step S6, the measurement unit 303 executes a process of converting the number of pixels acquired in step S5 into the amount of protrusion D of the partition 6 (i.e., a length between the side surface of the lower portion 61 and the end portion of the upper portion 62), based on, for example, conversion information prepared in advance.

The conversion information is generated based on, for example, the microscopic image including the sample whose size (length) is already known (i.e., a standard sample image including the sample observed by the optical microscope). More specifically, the conversion information indicating the length corresponding to one pixel is generated by counting the number of pixels arranged between (a pixel corresponding to) one end and (a pixel corresponding to) the other end of the sample included in the standard sample image and dividing the known size of the sample by the number of pixels. According to such conversion information, the number of pixels can be converted into the amount of protrusion D of the partition 6 by multiplying the length corresponding to one pixel indicated by the conversion information by the number of pixels acquired in step S5. The conversion information may be any information that enables the number of pixels to be converted into the length (i.e., information that the correspondence between the number of pixels and the length is defined).

The above-described conversion information will be described with reference to FIG. 17 to FIG. 19. First, FIG. 17 shows luminance values of fifty pixels constituting the to-be-measured area extracted from the microscopic image (hereinafter referred to as a first standard sample image) including the partition 6 whose amount of protrusion D is, for example, 0.80 μm, in graph format. Detailed description is omitted, but 7 is acquired as the number of pixels arranged between the first and second pixels according to the luminance value shown in FIG. 17. In this case, the conversion information generated based on the first standard sample image is 0.80 μm×$\frac{1}{7}$≈0.114 μm.

Figure 18:
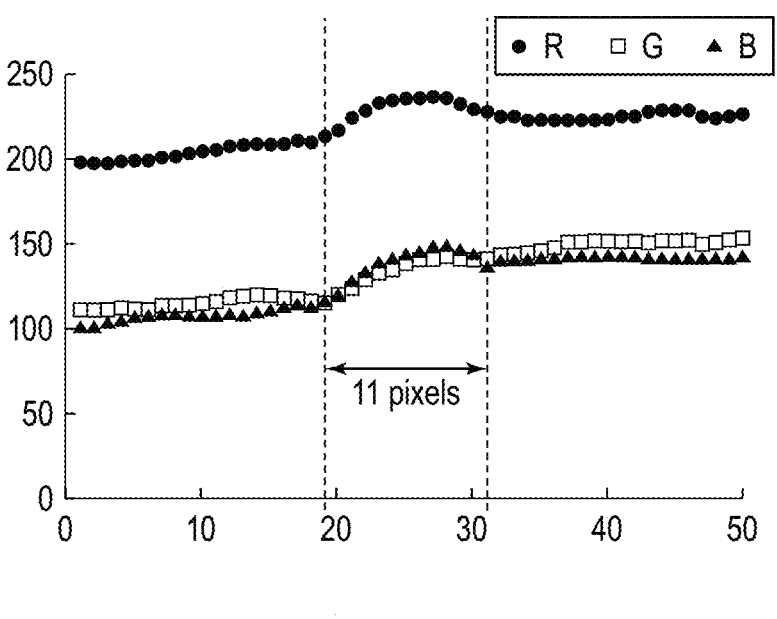
FIG. 18 is a graph illustrating conversion information generated based on a second standard sample image.

In addition, FIG. 18 shows luminance values of fifty pixels constituting the to-be-measured area extracted from the microscopic image (hereinafter referred to as a second standard sample image) including the partition 6 whose amount of protrusion D is 0.86 μm, in graph format. Detailed description is omitted, but 11 is acquired as the number of pixels arranged between the first and second pixels according to the luminance value shown in FIG. 18. In this case, the conversion information generated based on the second standard sample image is 0.86 μm×$\frac{1}{11}$≈0.78 μm.

Figure 19:
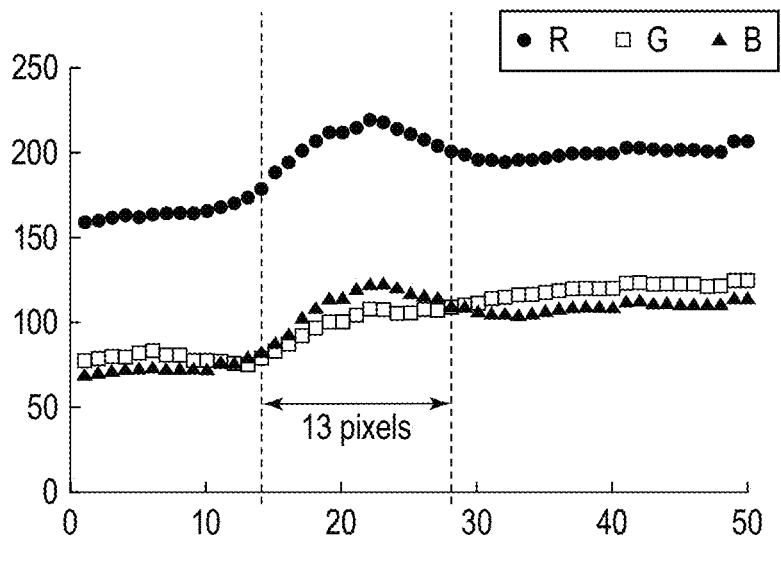
FIG. 19 is a graph illustrating conversion information generated based on a third standard sample image.

Furthermore, FIG. 19 shows luminance values of fifty pixels constituting the to-be-measured area extracted from the microscopic image (hereinafter referred to as a third standard sample image) including the partition 6 whose amount of protrusion D is 0.97 μm, in graph format. Detailed description is omitted, but 13 is acquired as the number of pixels arranged between the first and second pixels according to the luminance value shown in FIG. 19. In this case, the conversion information generated based on the third standard sample image is 0.97 μm×$\frac{1}{13}$≈0.75 μm.

In other words, in a case where the conversion information is generated based on the first to third standard sample images including the partition 6 whose amount of protrusion D is already known as described above, if the first to third standard sample images (to-be-measured areas) include the same position of the partition 6 formed on the base 10, it is considered that the conversion information of the same degree (i.e., small variation) is generated at a high possibility. In fact, however, the conversion information generated based on the first to third standard sample images (to-be-measured areas) is varied (i.e., the correspondence between the number of pixels and the length is different depending on the microscopic image) and, if the amount of protrusion D of the partition 6 is measured using, for example, one piece of conversion information prepared in advance, the measurement accuracy of the amount of protrusion D may be decreased. In contrast, according to the conversion information which is varied but generated based on the first to third standard sample images, the number of pixels and the length are considered to have a certain correlation.

For this reason, in step S6 described above, the amount of protrusion D of the partition may be measured (calculated) using a machine learning model generated by a machine learning algorithm such as a neural network, from the viewpoint of the correlation between the number of pixels and the length obtained from a plurality of standard sample images. Such a machine learning model may be constructed to output (predict) the amount of protrusion D of the partition 6 by inputting the number of pixels arranged between the first and second pixels, for example, by learning a data set including a combination of the number of (7, in this case) pixels arranged between the first and second pixels identified from the first standard sample image and the already known amount of protrusion D (0.80 μm, in this case) of the partition 6 included in the first standard sample image, a combination of the number of (11, in this case) pixels arranged between the first and second pixels identified from the second standard sample image and the already known amount of protrusion D (0.86 μm, in this case) of the partition 6 included in the second standard sample image, a combination of the number of (13, in this case) pixels arranged between the first and second pixels identified from the third standard sample image and the already known amount of protrusion D (0.97 μm, in this case) of the partition 6 included in the third standard sample image, and the like.

According to the configuration using such a machine learning model, it is considered possible to avoid the decrease in measurement accuracy in the amount of protrusion D which may be generated by the variation in conversion information generated based on the above-described standard sample images and to measure the amount of protrusion D with high accuracy.

When the amount of protrusion D of the partition 6 measured by executing the above-described process shown in FIG. 14 is appropriate, the display element 20 of each sub-pixel SP can be formed as described above with reference to FIG. 5 to FIG. 7.

It has been described that one to-be-measured area is extracted from the microscopic image to measure the amount of protrusion D of the partition 6 in FIG. 14 described above but, in the process shown in FIG. 14, a plurality of to-be-measured areas may be extracted from the microscopic image and the amount of protrusion D of the partition 6 may be measured in each of the plurality of to-be-measured areas (i.e., the measurement of the amount of protrusion D may be executed at a plurality of portions of the partition 6).

In addition, in general, a motherboard on which a plurality of display panels are formed on a mother base including a plurality of bases 10 is manufactured and the display device DSP is manufactured using each of the display panels cut from the motherboard, in the process of manufacturing the display device DSP, but the measuring device 300 of the embodiment is used in a case of measuring the amount of protrusion D of the partition 6 by observing the partition 6 from the back surface side of the motherboard (i.e., the surface on the side where the display element 20 and the like are not arranged) by the optical microscope 100 when the motherboard on which the insulating layer 11, the circuit layer 12, the insulating layer 13, the lower electrode LE, the rib 5, and the partition 6 are formed on the mother base is manufactured.

As described above, in the embodiment, the partition 6 including both the lower portion 61 arranged on the first surface 10A side of the base 10 and the upper portion 62 protruding from the side surface of the lower portion 61 is formed, the microscopic image (first image) including the partition 6 observed from the second surface 10B side opposed to the first surface 10A of the base 10 by the optical microscope 100 is acquired, the acquired microscopic image is analyzed, and the amount of protrusion D (i.e., the length from the side surface of the lower portion 61 to the end portion of the upper portion 62) of the partition 6 is measured based on the analysis result.

In the embodiment, since the display device DSP can be manufactured by measuring the amount of protrusion D of the partition 6 (i.e., confirming whether or not the amount of protrusion D of the partition 6 is appropriate), by the above-described configuration, decrease in the reliability of the display device DSP can be suppressed.

In addition, in the embodiment, the first pixel corresponding to (the end portion on the base 10 side of) the side surface of the lower portion 61 and the second pixel corresponding to the end portion of the shadow of the upper portion 62 are identified based on the luminance values of the plurality of pixels constituting the microscopic image, and the amount of protrusion D of the partition 6 is measured based on the number of pixels arranged between the identified first and second pixels. In the embodiment, with such a configuration, since the amount of protrusion D of the partition 6 can be automatically measured based on the microscopic image from the second surface 10B (i.e., the back surface) side of the base 10, labor for the measurement of the amount of protrusion D can be decreased.

In the embodiment, as described above, the amount of protrusion D of the partition 6 may be measured based on the number of pixels arranged between the first and second pixels identified from the microscopic image, but the amount of protrusion D of the partition 6 can be measured using, for example, the conversion information or the machine learning model. In this case, the conversion information may be prepared in advance, based on, for example, the standard sample image (second image) including the sample in which the size (length) observed by the optical microscope 100 is already known. In addition, the machine learning model may be prepared (generated) in advance by learning a data set including both the number of pixels arranged between the first and second pixels identified from the standard sample image (third image) including the partition 6 (sample) whose amount of protrusion D observed by the optical microscope 100 is already known, and the known amount of protrusion D (measured value).

In addition, in the embodiment, it has been described that the amount of protrusion D of the partition 6 is measured by executing the process shown in FIG. 14 but, for example, a machine learning model learning a data set including both the microscopic image including the partition 6 (sample) whose amount of protrusion D is already known and the known amount of protrusion D of the partition 6 may be prepared. According to such a configuration, for example, the measurement device 300 can acquire the amount of protrusion D of the partition 6 output from the machine learning model (i.e., predict the amount of protrusion D of the partition 6 included in the microscopic image from the microscopic image) by inputting the microscopic image output from the optical microscope 100 to the machine learning model.

Although detailed description is omitted, for example, the machine learning model for extracting the to-be-measured area from the microscopic image can be used by learning the data set including both the microscopic image and the to-be-measured area manually designated in the microscopic image and preparing in advance the machine learning model.

All measuring methods and measuring devices, which are implementable with arbitrary changes in design by a person of ordinary skill in the art based on the measuring methods and measuring devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A measuring method comprising:
forming a partition including a lower portion arranged on a first surface side of a base and an upper portion protruding from a side surface of the lower portion;
acquiring a first image including the partition observed from a second surface side opposed to the first surface of the base by an optical microscope;
analyzing the acquired first image; and
measuring an amount of protrusion by which an end portion of the upper portion protrudes from the side surface of the lower portion, based on the analysis result.

2. The measuring method of claim 1, wherein
the analyzing includes identifying a first pixel corresponding to the side surface of the lower portion, and a second pixel corresponding to the end portion of the upper portion, based on luminance values of a plurality of pixels constituting the first image, and
the measuring includes measuring the amount of protrusion, based on the number of pixels arranged between the identified first and second pixels.

3. The measuring method of claim 2, wherein
the measuring includes converting the number of pixels into the amount of protrusion, based on conversion information indicating a length corresponding to one pixel, and
the conversion information is prepared in advance, based on a second image including a sample whose size observed by the optical microscope is already known.

4. The measuring method of claim 2, wherein
the measuring includes acquiring the amount of protrusion output from a machine learning model by inputting the number of pixels arranged between the identified first and second pixels to the machine learning model, the machine learning model being generated by learning a data set prepared in advance, and
the data set includes the number of pixels arranged between the first and second pixels identified from a third image including the partition in which the amount of protrusion observed by the optical microscope is known, and the known amount of protrusion.

5. A measuring method comprising:
forming an insulating layer arranged on a first surface side of a base;
forming a lower electrode arranged on the insulating layer;

forming a rib which covers a part of the lower electrode and which includes an aperture overlapping with the lower electrode;
forming a partition including a lower portion arranged on the rib and an upper portion protruding from a side surface of the lower portion;
acquiring a first image including the partition observed from a second surface side opposed to the first surface of the base by an optical microscope;
analyzing the acquired first image; and
measuring an amount of protrusion at which an end portion of the upper portion protrudes from the side surface of the lower portion, based on the analysis result.

6. The measuring method of claim 5, wherein
the lower portion is formed of a first metal material, and
the upper portion is formed of a second metal material different from the first metal material.

7. The measuring method of claim 6, wherein
the first metal material includes aluminum or an aluminum alloy, and
the second metal material includes titanium.

8. The measuring method of claim 6, wherein
the lower portion includes a barrier layer arranged on the rib, and a metal layer arranged on the barrier layer,
the barrier layer is formed of a third metal material different from the first metal material, and
the metal layer is formed of the first metal material.

9. The measuring method of claim 8, wherein
the first metal material includes aluminum or an aluminum alloy,
the second metal material includes titanium, and
the third metal material includes molybdenum.

10. The measuring method of claim 5, wherein
the side surface of the lower portion is inclined to a direction perpendicular to the base such that a width of the lower portion becomes smaller toward the upper portion.

11. The measuring method of claim 5, wherein
the analyzing includes identifying a first pixel corresponding to an end portion on a side opposite to the side surface of the lower portion, and a second pixel corresponding to the end portion of the upper portion, based on luminance values of a plurality of pixels constituting the first image, and
the measuring includes measuring the amount of protrusion, based on the number of pixels arranged between the identified first and second pixels.

12. The measuring method of claim 11, wherein
the measuring includes converting the number of pixels into the amount of protrusion, based on conversion information indicating a length corresponding to one pixel, and
the conversion information is prepared in advance, based on a second image including a sample whose size is already known by the optical microscope.

13. The measuring method of claim 11, wherein
the measuring includes acquiring the amount of protrusion output from a machine learning model by inputting the number of pixels arranged between the identified first and second pixels to the machine learning model, the machine learning model being generated by learning a data set prepared in advance, and
the data set includes the number of pixels arranged between the first and second pixels identified from a third image including the partition in which the amount of protrusion observed by the optical microscope is known, and the known amount of protrusion.

14. The measuring method of claim 5, further comprising:

forming an organic layer which is in contact with the lower electrode through the aperture after measuring the amount of protrusion; and forming an upper electrode arranged on the organic layer.

15. The measuring method of claim 14, further comprising:

forming a cap layer arranged on the upper electrode; and forming a sealing layer arranged on the cap layer.

16. The measuring method of claim 5, wherein the insulating layer is formed of an organic material, and the rib is formed of an inorganic material.

17. A measuring device comprising:

an acquisition unit configured to acquire a first image including a partition observed by an optical microscope from a second surface side opposed to a first surface of a base in which the partition including a lower portion and an upper portion protruding from a side surface of the lower portion is formed on the first surface side;

an analysis unit configured to analyze the acquired first image; and a measurement unit configured to measure an amount of protrusion by which the end portion of the upper portion protrudes from the side surface of the lower portion, based on the analysis result.

18. The measuring device of claim 17, wherein the analysis unit is configured to identify a first pixel corresponding to the side surface of the lower portion, and a second pixel corresponding to the end portion of the upper portion, based on luminance values of a plurality of pixels constituting the first image, and the measurement unit is configured to measure the amount of protrusion, based on the number of pixels arranged between the identified first and second pixels.

19. The measuring device of claim 18, wherein the measurement unit is configured to convert the number of pixels into the amount of protrusion, based on conversion information indicating a length corresponding to one pixel, and the conversion information is prepared in advance, based on a second image including a sample whose size observed by the optical microscope is already known.

20. The measuring device of claim 18, wherein the measurement unit is configured to acquire the amount of protrusion output from a machine learning model by inputting the number of pixels arranged between the identified first and second pixels to the machine learning model, the machine learning model being generated by learning a data set prepared in advance, and the data set includes the number of pixels arranged between the first and second pixels identified from a third image including the partition in which the amount of protrusion observed by the optical microscope is already known, and the known amount of protrusion.

* * * * *